(12) United States Patent
Chiang et al.

(10) Patent No.: US 11,316,303 B2
(45) Date of Patent: Apr. 26, 2022

(54) HIGH FREQUENCY CONNECTOR WITH COMPONENT PROTECTING MEMBER AND METHOD OF MANUFACTURING THEREOF

(71) Applicant: JESS-LINK PRODUCTS CO., LTD., New Taipei (TW)

(72) Inventors: Shih Yao Chiang, New Taipei (TW); Chieh-Ming Cheng, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 299 days.

(21) Appl. No.: 16/677,466

(22) Filed: Nov. 7, 2019

(65) Prior Publication Data
US 2020/0328561 A1    Oct. 15, 2020

(30) Foreign Application Priority Data
Apr. 9, 2019 (TW) ................................. 108112322

(51) Int. Cl.
| | |
|---|---|
| *H01R 13/646* | (2011.01) |
| *H01R 13/46* | (2006.01) |
| *H05K 1/11* | (2006.01) |
| *H05K 3/34* | (2006.01) |
| *H01R 43/02* | (2006.01) |
| *H01R 12/53* | (2011.01) |

(52) U.S. Cl.
CPC ........... *H01R 13/646* (2013.01); *H01R 12/53* (2013.01); *H01R 13/46* (2013.01); *H01R 43/0256* (2013.01); *H05K 1/111* (2013.01); *H05K 3/34* (2013.01); *H05K 2201/09063* (2013.01); *H05K 2201/10356* (2013.01); *H05K 2201/10522* (2013.01)

(58) Field of Classification Search
CPC ....... H01R 13/646; H01R 12/53; H01R 13/46
USPC ........................................................ 439/519
See application file for complete search history.

(56) References Cited

U.S. PATENT DOCUMENTS

| | | | | |
|---|---|---|---|---|
| 6,053,770 A | * | 4/2000 | Blom ................... | H01R 12/526 439/579 |
| 6,203,341 B1 | * | 3/2001 | Chen ................... | H01R 13/6215 439/186 |
| 6,716,057 B1 | * | 4/2004 | Wu ...................... | H01R 13/6589 439/497 |

(Continued)

FOREIGN PATENT DOCUMENTS

| CN | 2466822 Y | 12/2001 |
|---|---|---|
| CN | 102468561 A | 5/2012 |

(Continued)

*Primary Examiner* — Alexander Gilman

(57) ABSTRACT

A high frequency connector includes a case, a circuit board, a component protecting member and a cable. The circuit board is configured in the case and includes an electronic component and a plurality of solder pads. The component protecting member includes a case body and is configured on the circuit board. One side of the case body has an opening, and a containing space is formed between the opening and the inner face of the case body. A crossing structure is formed by the outer surface of the other side of the case body. When the component protecting member is configured on the circuit board, the component protecting member covers the electronic component in the containing space to maintain the transmission characteristics of the electronic component.

8 Claims, 12 Drawing Sheets

(56) References Cited

U.S. PATENT DOCUMENTS

| | | | | |
|---|---|---|---|---|
| 7,033,202 B2* | 4/2006 | Wu | ................... | H01R 13/6215 |
| | | | | 439/362 |
| 7,118,411 B2* | 10/2006 | Huang | ................ | H01R 31/065 |
| | | | | 439/502 |
| 7,530,844 B2* | 5/2009 | Shen | ................. | H01R 13/5045 |
| | | | | 439/598 |
| 7,563,136 B1* | 7/2009 | Wu | ................. | H01R 13/65912 |
| | | | | 439/607.35 |
| 7,578,680 B1* | 8/2009 | Wu | ................... | H01R 13/6658 |
| | | | | 439/79 |
| 7,758,374 B2* | 7/2010 | Yu | ................... | H01R 13/65912 |
| | | | | 439/493 |
| 8,303,358 B1* | 11/2012 | Hung | ................. | H01R 12/774 |
| | | | | 439/892 |
| 8,562,378 B2* | 10/2013 | Su | ..................... | H01R 13/6581 |
| | | | | 439/607.55 |
| 8,647,149 B2* | 2/2014 | Tanaka | ............... | H01R 9/0512 |
| | | | | 439/579 |
| 9,431,781 B2* | 8/2016 | Kuang | ................... | H01R 24/60 |
| 9,847,607 B2* | 12/2017 | Bopp | ................... | H01R 4/2429 |
| 9,979,138 B1* | 5/2018 | Chen | ................ | H01R 13/7137 |
| 10,096,950 B2* | 10/2018 | Wu | ..................... | H01R 13/6616 |
| 10,333,249 B1* | 6/2019 | Wang | ................ | H01R 13/6205 |
| 10,574,004 B2* | 2/2020 | Akita | .................... | H01B 11/00 |
| 10,950,962 B2* | 3/2021 | Schmidbauer | ....... | H01R 12/732 |
| 2010/0315752 A1* | 12/2010 | Rabu | ...................... | H01R 31/06 |
| | | | | 361/103 |
| 2015/0288110 A1* | 10/2015 | Taniguchi | .......... | H01R 13/6683 |
| | | | | 439/620.22 |
| 2016/0006190 A1* | 1/2016 | Katsuura | ............... | H01R 24/28 |
| | | | | 439/502 |
| 2017/0110837 A1* | 4/2017 | Taniguchi | .......... | H01R 13/6683 |
| 2020/0328561 A1* | 10/2020 | Chiang | ................. | H05K 3/301 |
| 2021/0005350 A1* | 1/2021 | Kim | ........................ | H01B 9/04 |

FOREIGN PATENT DOCUMENTS

| | | |
|---|---|---|
| CN | 206758712 U | 12/2017 |
| TW | M584043 U | 9/2019 |

* cited by examiner

HIGH FREQUENCY CONNECTOR WITH COMPONENT PROTECTING MEMBER AND METHOD OF MANUFACTURING THEREOF

CROSS-REFERENCE TO RELATED APPLICATION

This application claims priority to and the benefit of Taiwan Patent Application No. 108112322, filed on Apr. 9, 2019, the disclosure of which is incorporated herein by reference in its entirety.

BACKGROUND OF THE INVENTION

1. Field of the Invention

The present invention relates to a high frequency component protecting member, more particularly, to a high frequency component protecting member applied to the high frequency connector and capable of maintaining the signal transmission characteristics of high frequency electronic components.

2. Description of the Prior Art

Connectors are connecting components and accessories for electrical signals, and the electronic devices translate and transmit the signal to each other through the cables and connectors. That is to say, the connectors are the communicating bridges for the signals. The connectors are widely applied on cars and computer peripheral and communicating data applications, industries, military and aerospace industry, transportation, consumer electronics, medical treatments, instruments, commercial equipment and so on. Therefore, the connectors play an important role in many fields. In this well developed and efficient generation, the transmission speed of the signal is being developed toward high speed continuously. The high frequency connectors also have been developed to increase the transmission speed of the signal.

However, the signal attenuation is a problem when transmitting the signals in high frequency bands. The signal attenuation includes conductive loss and dielectric loss, and the degree of the signal attenuation is enhanced by the increased distance. Therefore, the signal transmitting distance of the connector will decrease due to the signal attenuation.

The medium covering the high frequency electronic component and the circuit layout on the circuit board directly affects the signal transmission characteristics when designing the circuit of high frequency connectors. In general, the optimum medium is air (dielectric constant, Dk=1). Therefore, the design of the circuit board in connector industry disposes the solder pads of the wires on the edge of the circuit board to avoid affecting the high frequency electronic component.

With the rapid development of technology, various electronic devices become lighter, thinner, shorter and smaller, and the circuit boards, electronic components, and wires in the connector become more and more fine. Due to the limitations and the versatile requirements of the circuit board, some of the solder pads must be configured on the non-edge positions of the circuit board. It means that some of the wires must be configured across the high frequency electronic components. In the prior art, in order to dispose the wires across the electronic components, the insulation glue or other similar fixing material would be pasted between the wires and the circuit board to make the wires across the high frequency electronic component and connect the circuit board by the insulation glue. However, the insulation glue also covers the high frequency electronic component on the circuit board, which causes the dielectric coefficient around the high frequency electronic component to become greater and to increase the dielectric loss, so as to seriously affects the signal transmission characteristics.

Therefore, it is necessary to develop a high frequency component protecting member to ensure the electronic component of the high frequency connector to maintain good signal transmission characteristics to solve the problem of the prior art.

SUMMARY OF THE INVENTION

Therefore, a category of the present invention is to provide a high frequency connector, which can protect the high frequency electronic components on the circuit board and maintain the signal transmission characteristics.

In an embodiment of the present invention, the high frequency connector includes a case, a circuit board, a component protecting member and a cable. The circuit board is configured in the case and has an electronic component and a plurality of solder pads disposed thereon. The component protecting member includes a case body and is configured on the circuit board. One side of the case body has an opening. A containing space is formed by the opening and an inner surface of the case body, and a crossing structure is disposed on an outer surface of the other side of the case body. The electronic component of the circuit is contained in the containing space. The cable includes an insulating part and a conductive part disposed on the terminal of the cable. The insulating part of the cable is configured on the crossing structure, and the conductive part of the cable is soldered on the solder pads of the circuit board.

The circuit board further includes at least one positioning hole, and the component protecting member includes at least one positioning pin. The size of the at least one positioning pin is corresponding to that of the positioning hole.

The maximum height of the containing space is greater than that of the electronic component to prevent the electronic component from contacting the inner surface of the case body.

The shape of the crossing structure is one selected from the group consisting of a circular arc shape, a polygonal shape and a combination of both.

The crossing structure further includes at least one groove, and the cable is configured in the groove.

The high frequency connector further includes a colloid pasted on the cable and the circuit board, and the component protecting member blocks the colloid out of the containing space.

Another one category of the present invention is to provide a method for manufacturing the high frequency connector. The method includes the following steps of: soldering a conductive part of a first cable on a first pad of a circuit board; disposing a component protecting member on the circuit board to make the component protecting member to cover an electronic component of the circuit board; configuring a second cable across the component protecting member and soldering the second cable on a second solder pad of the circuit board; pasting a colloid on the first solder pad and the second solder pad of the circuit board; and disposing the circuit board, the component protecting member, the first cable and the second cable in a case.

The step of disposing a component protecting member on the circuit board to make the component protecting member to cover an electronic component of the circuit board further includes the step of: inserting at least one positioning pin of the component protecting member into at least one positioning hole of the circuit board correspondingly to make a containing space of the component protecting member to contain the electronic component.

The step of configuring a second cable across the component protecting member and soldering the second cable on a second solder pad of the circuit board further includes the step of: configuring the insulating part of the second cable on the crossing structure of the component protecting member, and soldering the conductive part of the second cable on the second solder pad of the circuit board.

The step of configuring a second cable across the component protecting member and soldering the second cable on a second solder pad of the circuit board further includes the step of: configuring the second cable in at least one groove of the component protecting member and soldering the second cable on the second solder pad of the circuit board.

In summary, the high frequency connector of the present invention ensures that the electronic component can contact with dielectric medium well to maintain the transmission characteristic of the electronic component by the component protecting member covering the electronic component and the corresponding circuit.

BRIEF DESCRIPTION OF THE APPENDED DRAWINGS

DETAILED DESCRIPTION OF THE INVENTION

For the sake of the advantages, spirits and features of the present invention can be understood more easily and clearly, the detailed descriptions and discussions will be made later by way of the embodiments and with reference of the diagrams. It is worth noting that these embodiments are merely representative embodiments of the present invention, wherein the specific methods, devices, conditions, materials and the like are not limited to the embodiments of the present invention or corresponding embodiments. Moreover, the devices in the figures are only used to express their corresponding positions and are not drawing according to their actual proportion.

Figure 1:
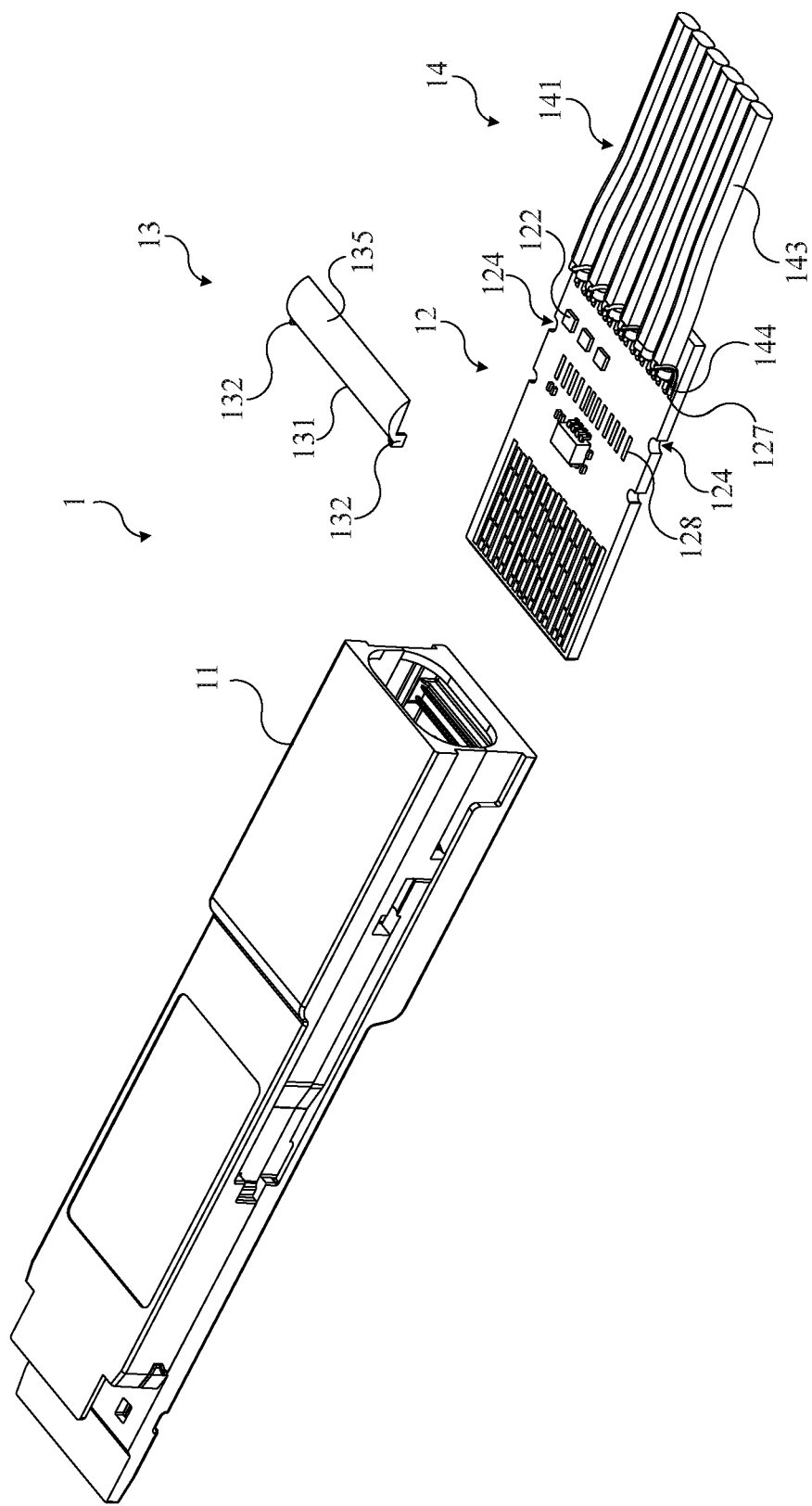
FIG. 1 is an exploded diagram illustrating a high frequency connector according to one embodiment of the present invention.
Figure 2:
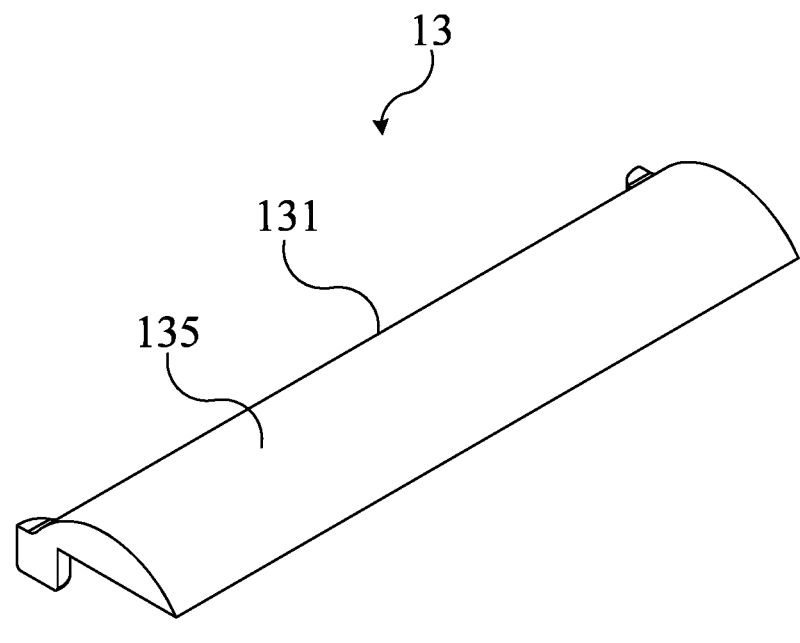
FIG. 2 is a structural schematic diagram illustrating the component protecting member of FIG. 1.
Figure 2:
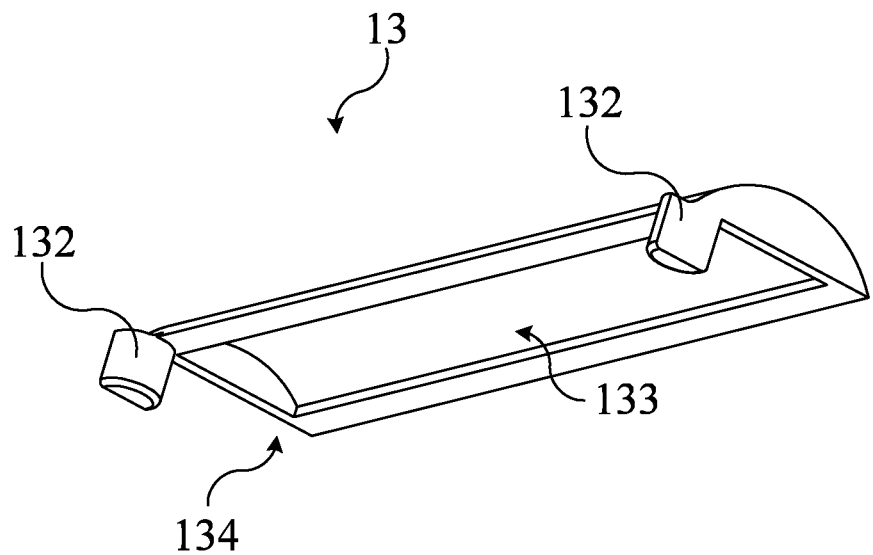
Figure 3:
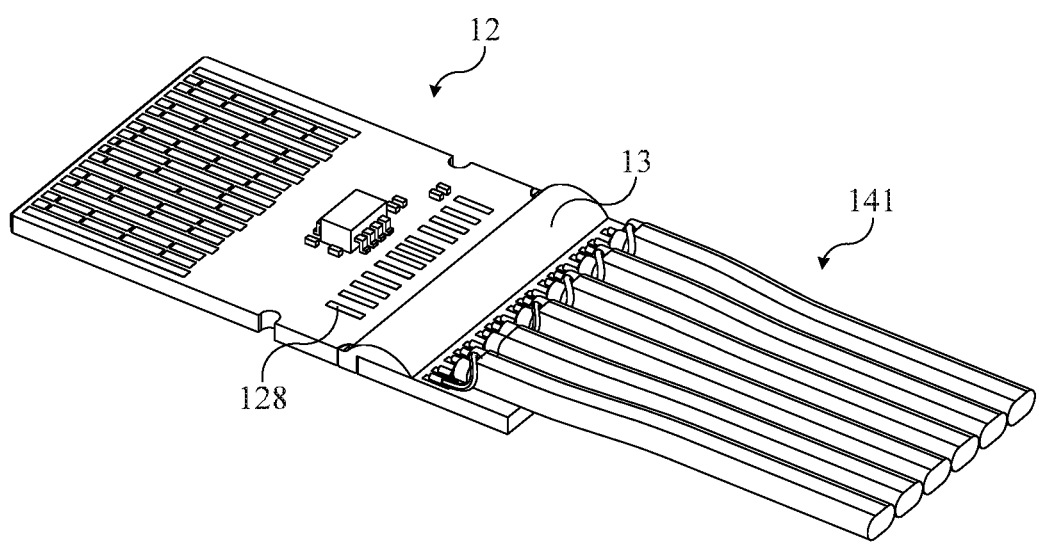
FIG. 3 is an assembly schematic diagram illustrating the circuit board and the component protecting member of FIG. 1.
Figure 4:
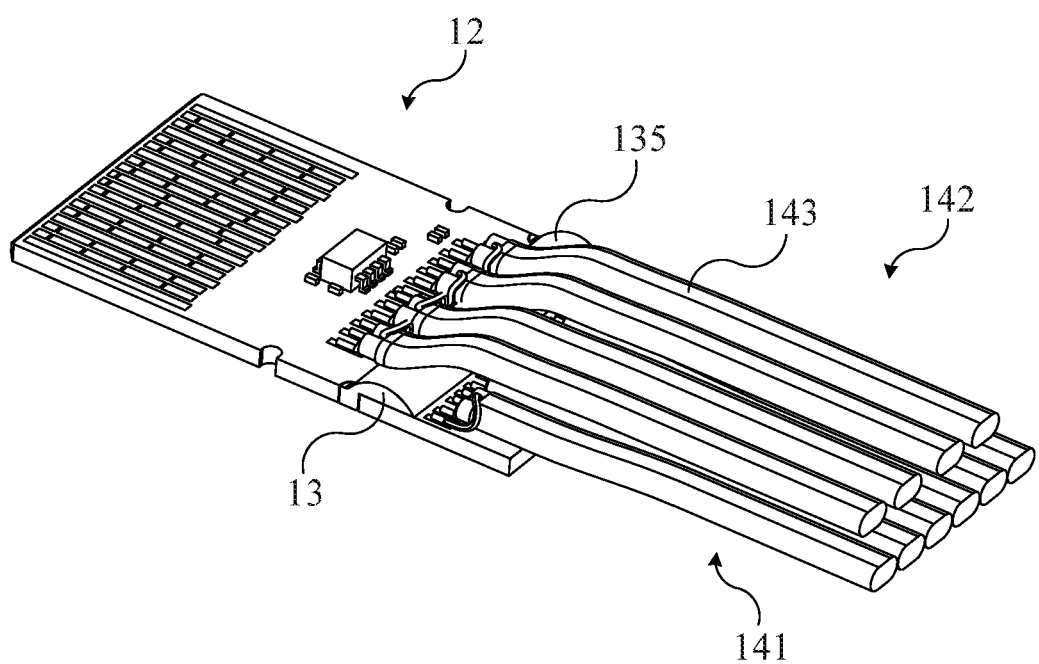
FIG. 4 is a schematic diagram illustrating the circuit board and the component protecting member according to one embodiment of the present invention.

Please refer to FIG. 1, FIG. 2, FIG. 3 and FIG. 4. FIG. 1 is an exploded diagram illustrating a high frequency connector 1 according to one embodiment of the present invention. FIG. 2 is a structural schematic diagram illustrating the component protecting member 13 of FIG. 1. FIG. 3 is an assembly schematic diagram illustrating the circuit board 12 and the component protecting member 13 of FIG. 1. FIG. 4 is a schematic diagram illustrating the circuit board 12 and the component protecting member 13 according to one embodiment of the present invention.

As shown in FIG. 1, the high frequency connector 1 of this embodiment includes a case 11, a circuit board 12, a component protecting member 13 and a cable 14. The circuit board 12 is configured in the case 11 and has a plurality of solder pads 127 and 128, an electronic component 122 and at least two positioning holes 124. The component protecting member 13 includes a case body 131 and at least two positioning pins 132 extended from the case body 131. The component protecting member 13 can be configured on the circuit board 12 by the positioning pins 132 inserting into the positioning holes 124 of the circuit board 12. One side of the case 11 includes an opening, and the circuit board 12 can be inserted and configured in the case 11 through the opening of the case 11.

As shown in FIG. 2, one side of the case body 131 of the component protecting member 13 has an opening 134. A containing space 133 is formed by the opening 134 and the inner surface of the case body 131, and a crossing structure 135 is disposed on the outer surface of the other side of the case body 131. The positioning pins 132 extend outward from the case body 131. In detail, the positioning pins 132 of this embodiment extend from the direction of the opening 134 of the case body 131. Moreover, the position and shape of the positioning pins 132 are corresponding to those of the positioning holes 124 of the circuit board 12, and the size of the positioning pins 132 can be slightly smaller than that of the positioning holes 124.

In practice, the component protecting member 13 is disposed on the circuit board 12 through the positioning pins 132 inserting into the positioning holes 124 of the circuit board 12. At this time, the bottom plane on the side of the opening 134 of the case body 131 of the component protecting member 13 attaches to the circuit board 12 so that the containing space 133 contains the electronic component 122 on the circuit board 12. That is to say, the component protecting member 13 covers the electronic component 122 on the circuit board 12. The electronic component 122 can be a high frequency transmitting or communicating electronic component. In this embodiment, the component protecting member 13 covers three electronic components 122, but it is not limited to three in practice. The number of the electronic component 122 can be 1, 2 or more than 3. Since the component protecting member 13 only needs to insert the positioning pins 132 into the positioning holes 124 of the circuit board 12 to be configured on the circuit board 12, the installation hours can be saved. It is worth to note that the positioning pins 132 of the component protecting member 13 in FIG. 2 are located on the same side and at the corners of the case body 131, but it is not limited thereto. In another embodiment, the positioning pins 132 of the component protecting member 13 can be located at the opposite corners or non-corner positions of the case body 131, which are corresponding to the positioning holes 124 of the circuit board 12. The shapes of the positioning pins 132 and the positioning holes 124 can be a circular shape or semi-circular shape (as shown in FIG. 2), also can be a polygon or corresponding shape. Moreover, the number of the positioning pins 132 is not limited to two in FIG. 1 and FIG. 2, the number of the positioning pin 132 configured on the case body 131 can be 1, 2 or more than 3. Similarly, the circuit board 12 has the positioning holes 124 with the corresponding positions and numbers to the positioning pins 132.

In general, the cable soldering positions of the connector are designed on the edge of the circuit board to prevent the cable from contacting the electronic component and affecting the transmission characteristic of the electronic component. As shown in FIG. 1, a first solder pad 127 is located on the edge of the circuit board 12. The first cable 141 can be soldered on the first solder pad 127 without contacting the electronic component when the conductive part 144 of the first cable 141 is soldered on the first solder pad 127. However, some of the cable soldering positions must be located on the non-edge positions of the circuit board under the situation of insufficient configuration space on the circuit board. As shown in FIG. 1 and FIG. 4, a second solder pad 128 is located among the electronic components 122 of the circuit board 12. Therefore, the insulating part 143 of the second cable 142 would contact the electronic component 122 when the conductive part 144 of the second cable 142 is soldered on the second solder pad 128. In practice, the medium covering on the electronic component 122 of the circuit board 12 affects the signal transmission characteristics, such as transmitting speed, signal integrity and so on. The optimum covering medium is air (the dielectric constant is 1, Dk=1). The dielectric constant of the electric component 122 is greater than 1 when the insulating part 143 of the second cable 142 contacts the electronic component 122. At this time, the transmission characteristic of the electronic component is affected, such as increasing the signal attenuation and reducing the transmission speed. Therefore, when the component protecting member 13 is configured on the circuit board 12, it can separate the electronic component 122 from the second cable to make the electronic component 122 not to contact the second cable 142 directly, and then maintain the transmission characteristic of the electronic component 122. In this embodiment, the second cable 142 is configured on the crossing structure 135 of the component protecting member 13 when the second cable 142 is soldered on the second solder pad 128, as shown in FIG. 4. Therefore, the component protecting member 143 blocks the second cable 142 by the case body 131 and protects the electronic component 122 through the containing space 133 to ensure the optimum dielectric medium around the electronic component 122, and then to maintain the transmission characteristic of the electronic component 122.

Moreover, in this embodiment, the maximum height of the containing space 133 of the component protecting member 13 is greater than that of the electronic component 122 of the circuit board 12. In practice, the component protecting member 13 not only blocks the second cable 142 from the electronic component 122, but also prevents the electronic component 122 from contacting the inner surface of the case body 131 of the component protecting member 13, so as to ensure the optimum dielectric medium around the electronic component 122 to maintain the signal transmission characteristics of the electronic component 122.

Figure 5:
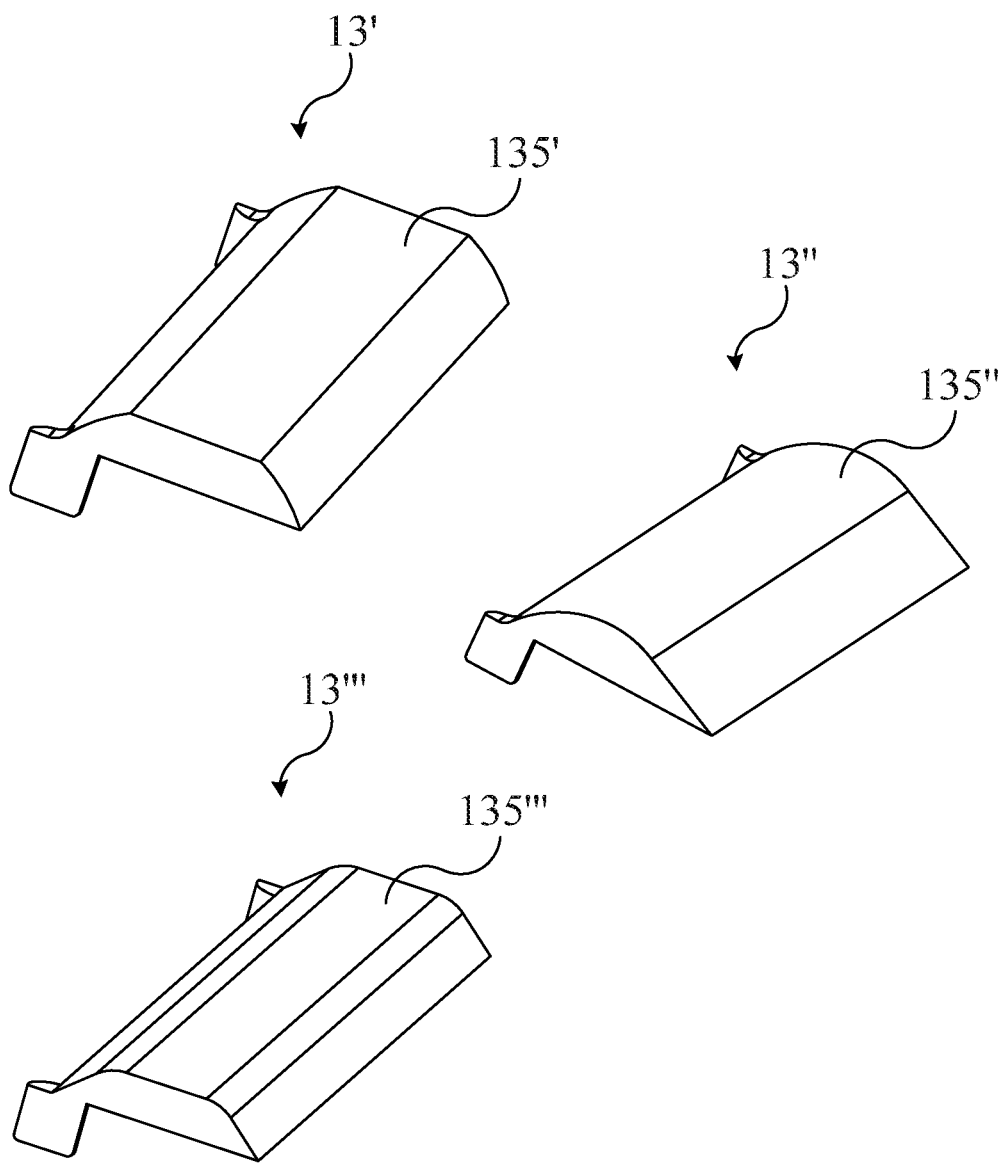
FIG. 5 is a schematic diagram illustrating the different shapes of the component protecting member according to another embodiment of the present invention.

In the above embodiment, the component protecting member 13 is a curved sheet-like structure, but it is not limited thereto. Please refer to FIG. 5. FIG. 5 is a schematic diagram illustrating the different shapes of the component protecting members 13', 13", and 13''' according to another one embodiment of the present invention. As shown in FIG. 5, the shapes of the crossing structures 135', 135", 135''' of the component protecting members 13', 13", 13''' can also be a polygon (such as a trapezoid or polygon with lead angle) or a combination of circular arc shape and polygon (such as a polygon with arc lead angle). In practice, any structure capable of forming a containing space and enabling the cable to be configured thereon can be adopted as the crossing structure of the component protecting member of the present invention. In another embodiment, the component protecting member 13 can include at least one rib configured at the inner surface of the case body to improve the structure strength of the component protecting member 13.

Figure 6A:
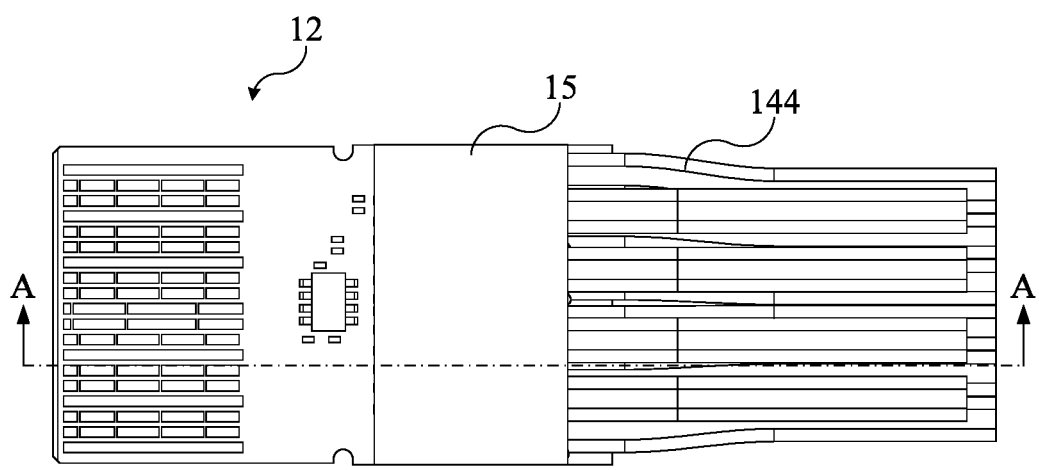
FIG. 6A is a schematic diagram illustrating a high frequency connector according to another embodiment of the present invention.
Figure 6B:
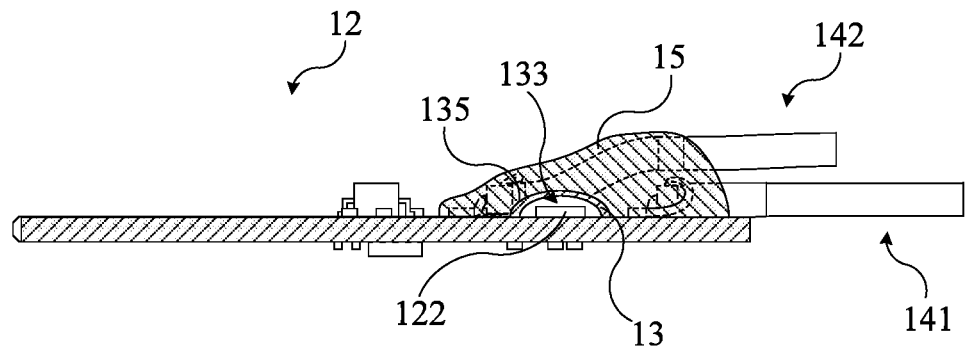
FIG. 6B is a sectional diagram of the high frequency connector along the line A-A in FIG. 6A.

Please refer to FIG. 4, FIG. 6A and FIG. 6B. FIG. 6A is a schematic diagram illustrating a high frequency connector 1 according to another embodiment of the present invention. FIG. 6B is a sectional diagram of the high frequency connector 1 along the line A-A in FIG. 6A. As shown in FIG. 6A and FIG. 6B, the difference between the above embodiment and this embodiment is that a colloid 15 is used to adhere and fix the conductive parts 144 of the first cable 141 and the second cable 142 to the first solder pad 127 and the second solder pad 128 of the circuit board 12 respectively after soldering the first cable 141 and the second cable 142 on the circuit board 12. In this embodiment, the colloid 15 is further pasted on the insulating part 143 of the first cable 141 and the second cable 142 and the component protecting member 13. In practice, the colloid 15 fixes the first cable 141, the second cable 142 and the component protecting member 13 on the circuit board 12. It not only increases the holding strength of the first cable 141 and the second cable 142 and prevent the first cable 141 and the second cable 142 from being pulled off, but also prevents the component protecting member 13 from falling off. The component protecting member 13 can exclude the colloid 15 from the containing space 133 when the colloid 15 is pasted on the circuit board 12. Therefore, the electronic component 122 in the containing space 133 would not contact with the colloid 15, so as to maintain the signal transmission characteristics. In practice, the colloid 15 can be a waterproof glue or insulation glue. In another embodiment, the colloid 15 can be pasted on the circuit board 12, also can be pasted between the circuit board 12 and case 11 to make the structure of high frequency connector become more stable.

Figure 7:
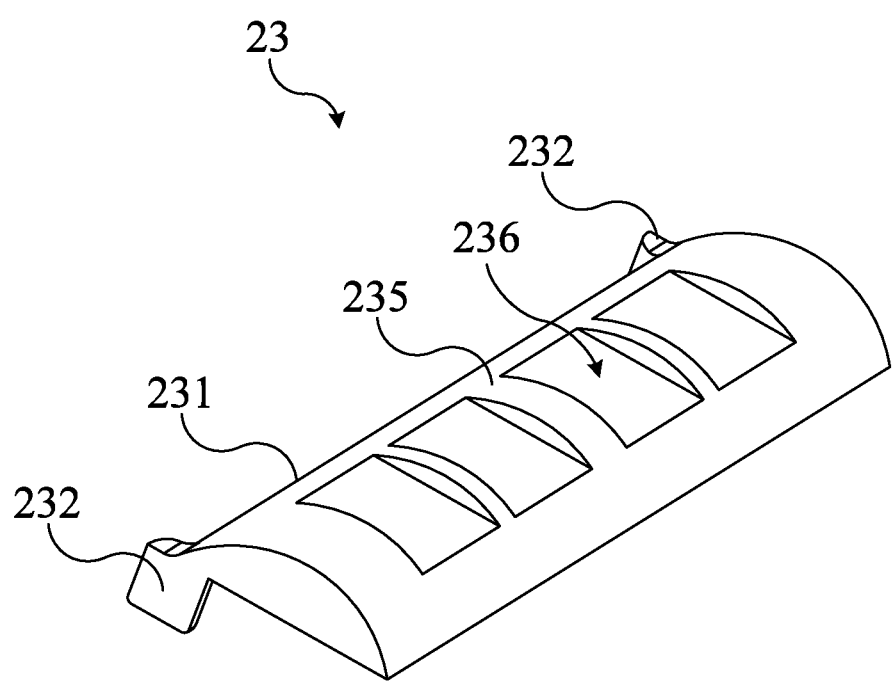
FIG. 7 is a schematic diagram illustrating the component protecting member according to another embodiment of the present invention.
Figure 8:
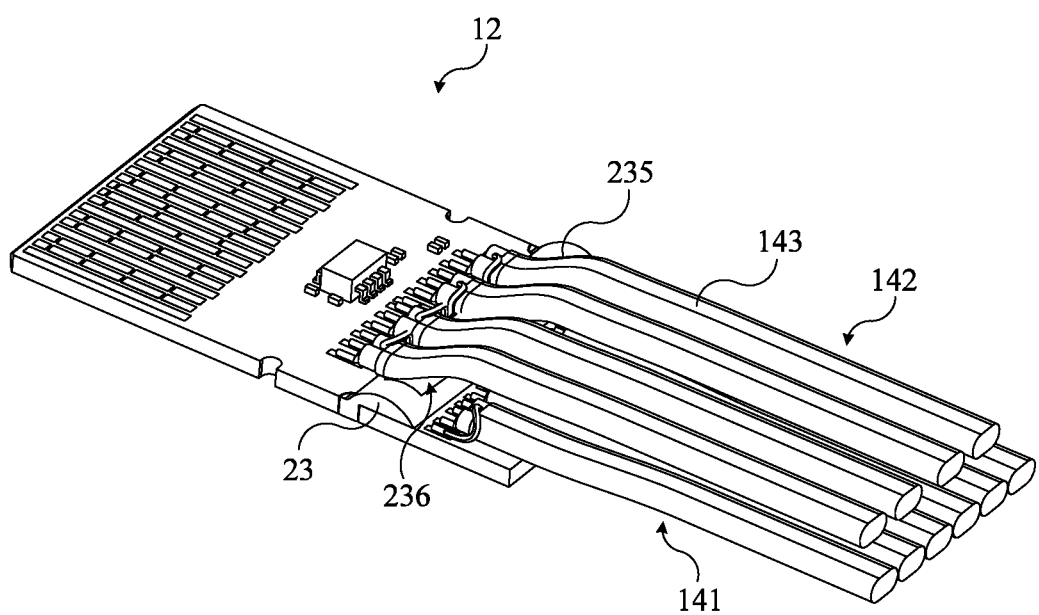
FIG. 8 is an assembly schematic diagram illustrating the component protecting member and the circuit board of FIG. 7.

Please refer to FIG. 7 and FIG. 8. FIG. 7 is a schematic diagram illustrating the component protecting member 23 according to another one embodiment of the present invention. FIG. 8 is an assembly schematic diagram illustrating the component protecting member 23 and the circuit board 12 of FIG. 7. As shown in FIG. 7 and FIG. 8, the difference between the above embodiment and this embodiment is that the case body 231 of the component protecting member 23 includes at least one groove 236 configured on the outer surface of the crossing structure 235, so that the second cable 142 can be configured into each groove 236 when the component protecting member 23 is configured on the circuit board 12. In practice, the component protecting member 23 including the groove 236 not only makes the second cable 142 to be arranged neatly and less entangled, but also saves the space. Although the number of the grooves 236 of the component protecting member 23 is four in FIG. 7 and FIG. 8, but it is not limited thereto. The number of the grooves 236 can be 1, 2, 3 or more than 4 to match that of the second cable 142 configured on the component protecting member 23.

Figure 9:
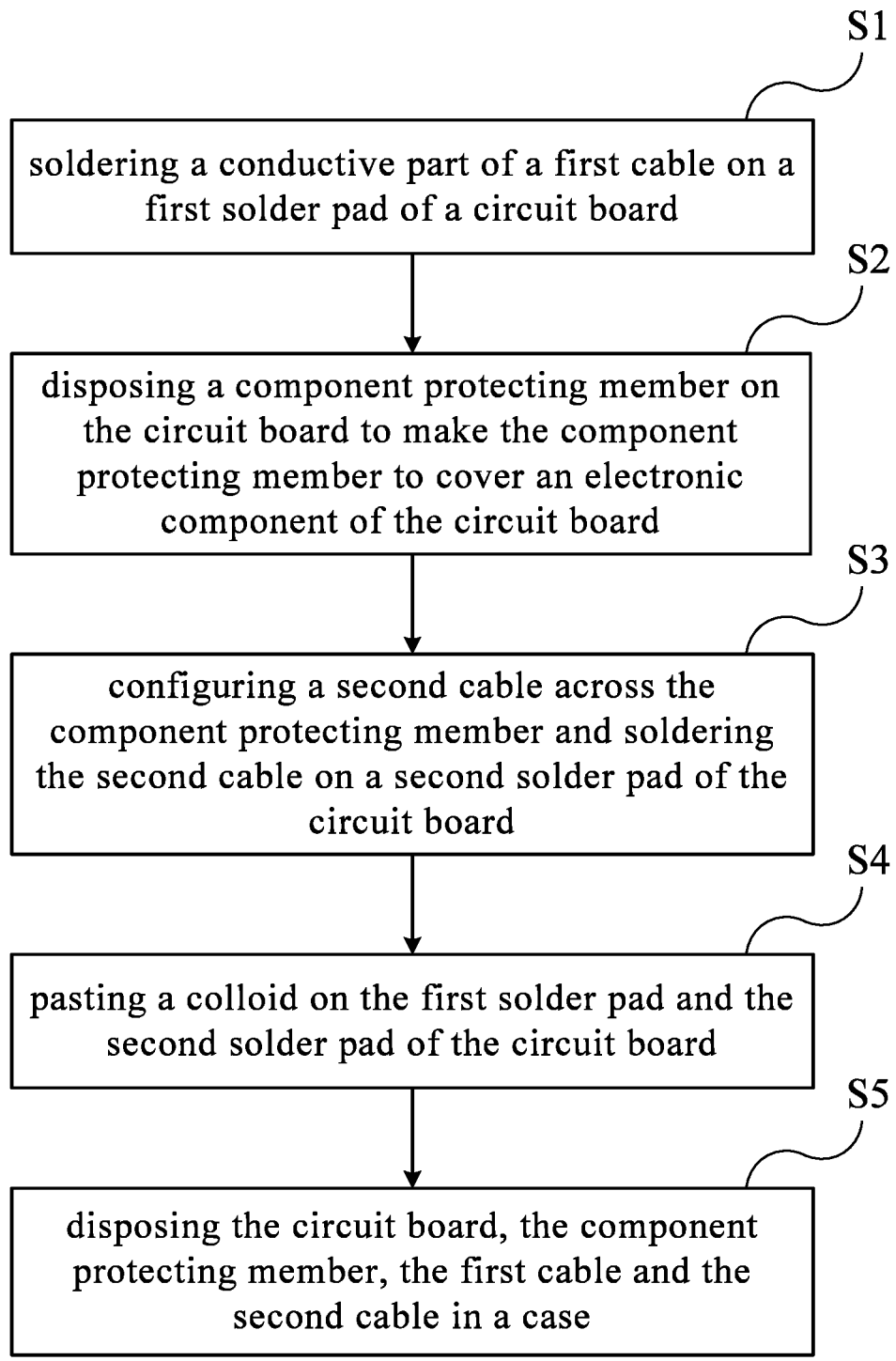
FIG. 9 is a flow diagram illustrating a method for manufacturing the high frequency connector according to one embodiment of the present invention.

Please refer to FIG. 9. FIG. 9 is a flow diagram illustrating a method for manufacturing the high frequency connector according to one embodiment of the present invention. The present invention also provides a method for manufacturing the high frequency connector including the following steps of: step S1: soldering a conductive part of a first cable on a first solder pad of a circuit board; step S2: disposing a component protecting member on the circuit board to make the component protecting member to cover a electronic component of the circuit board; step S3: configuring a second cable across the component protecting member and soldering the second cable on a second solder pad of the circuit board; step S4: pasting a colloid on the first solder pad and the second solder pad of the circuit board; and step S5: disposing the circuit board, the component protecting member, the first cable and the second cable in a case. The method for manufacturing the high frequency connector shown in FIG. 9 can be achieved through the high frequency connector 1 shown in FIG. 1 and FIG. 4. The functions of the units mentioned in the steps of this embodiment are substantially the same as those of the corresponding units in the above embodiments, and thus will not be described herein. In practice, the sequence of step S1 and step S2 can be exchanged.

Figure 10:
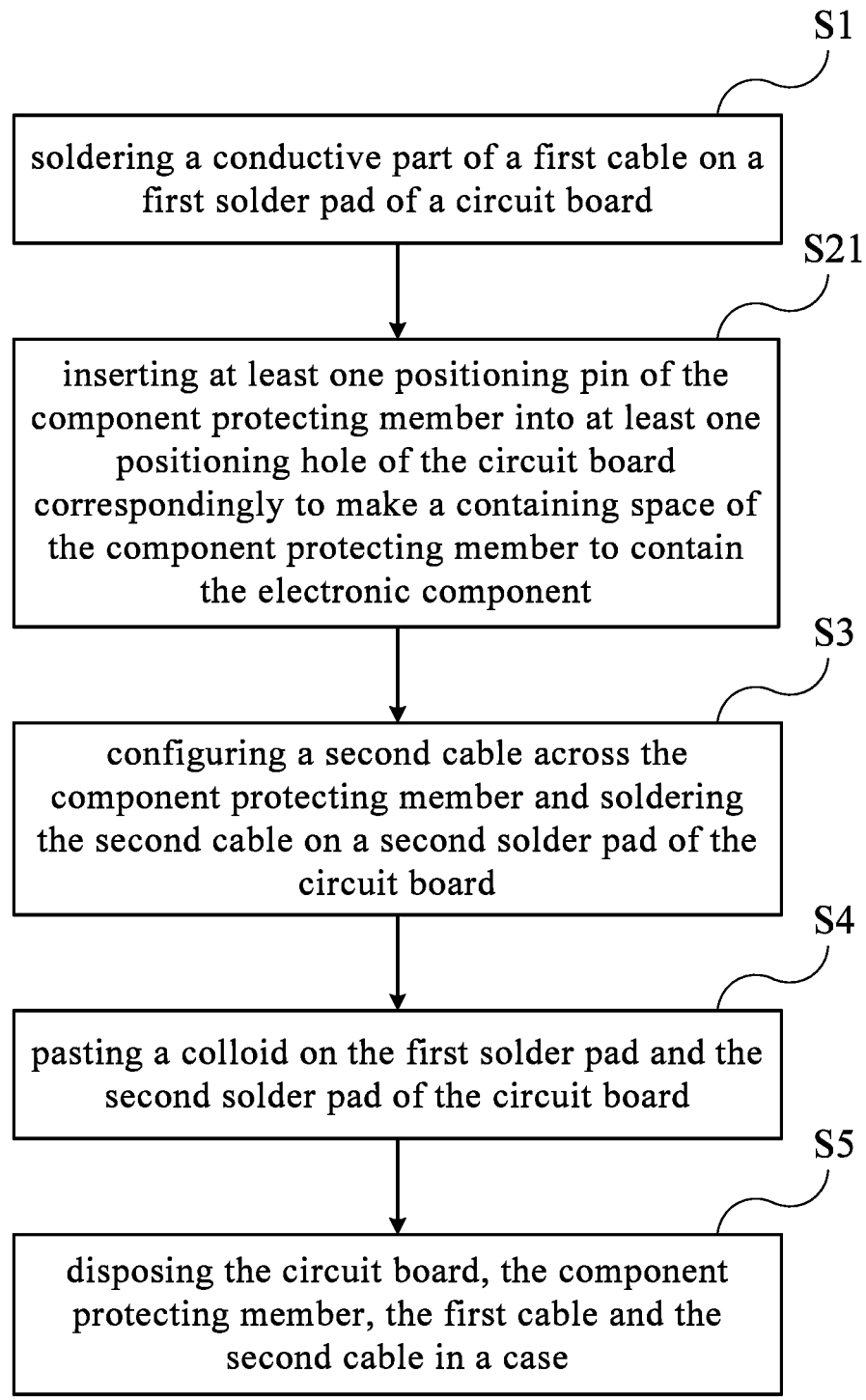
FIG. 10 is a flow diagram illustrating the method for manufacturing the high frequency connector according to one embodiment of the present invention.

Please refer to FIG. 10. FIG. 10 is a flow diagram illustrating the method for manufacturing the high frequency connector according to one embodiment of the present invention. Step S2 further includes step S21: inserting at least two positioning pins of the component protecting member into at least two positioning holes of the circuit board correspondingly to make a containing space of the component protecting member to contain the electronic component.

Figure 11:
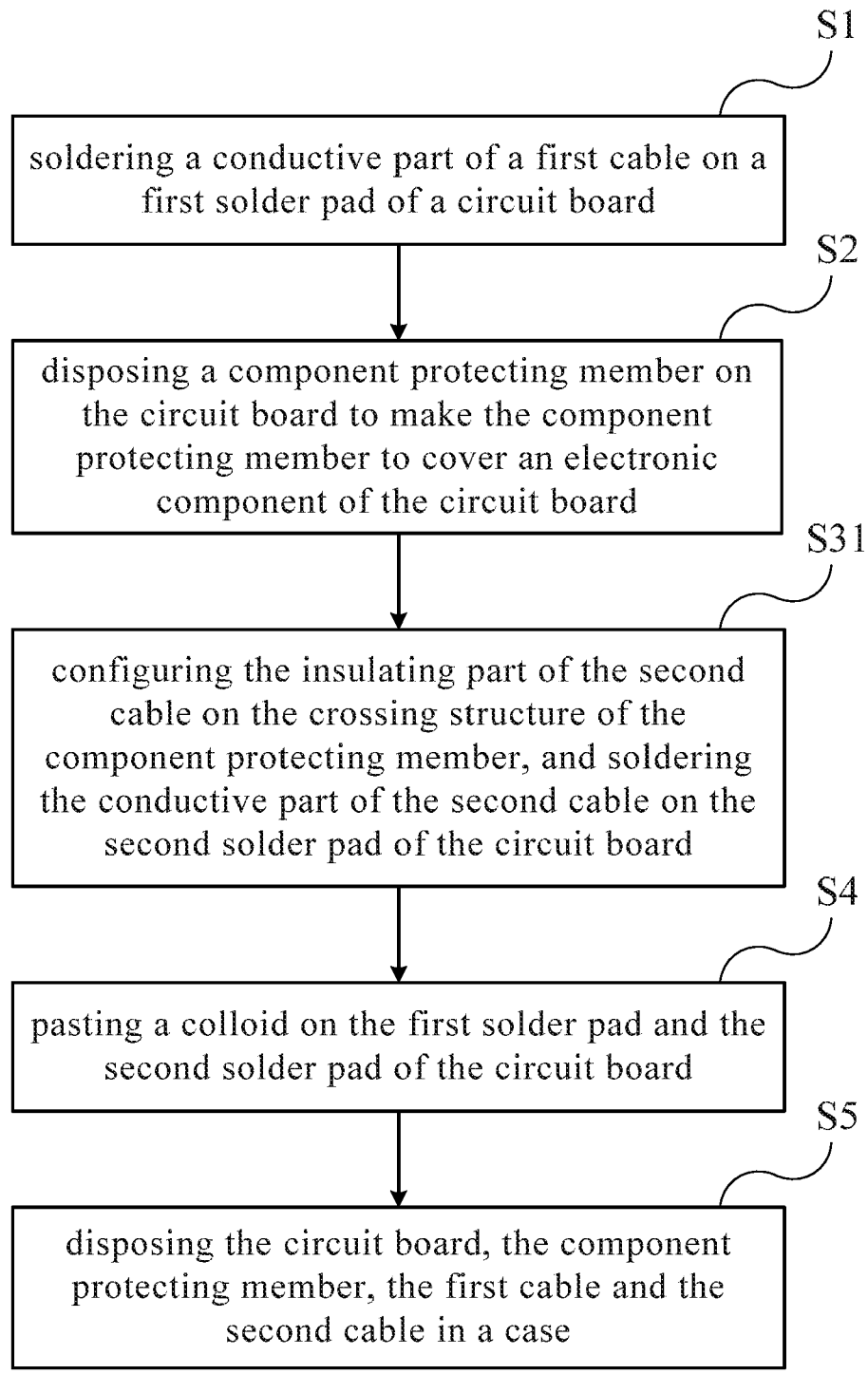
FIG. 11 is a flow diagram illustrating the method for manufacturing the high frequency connector according to one embodiment of the present invention.

Please refer to FIG. 11. FIG. 11 is a flow diagram illustrating the method for manufacturing the high frequency connector according to one embodiment of the present invention. Step S3 further includes step S31: configuring the insulating part of the second cable on the crossing structure of the component protecting member, and soldering the conductive part of the second cable on the second solder pad of the circuit board.

Figure 12:
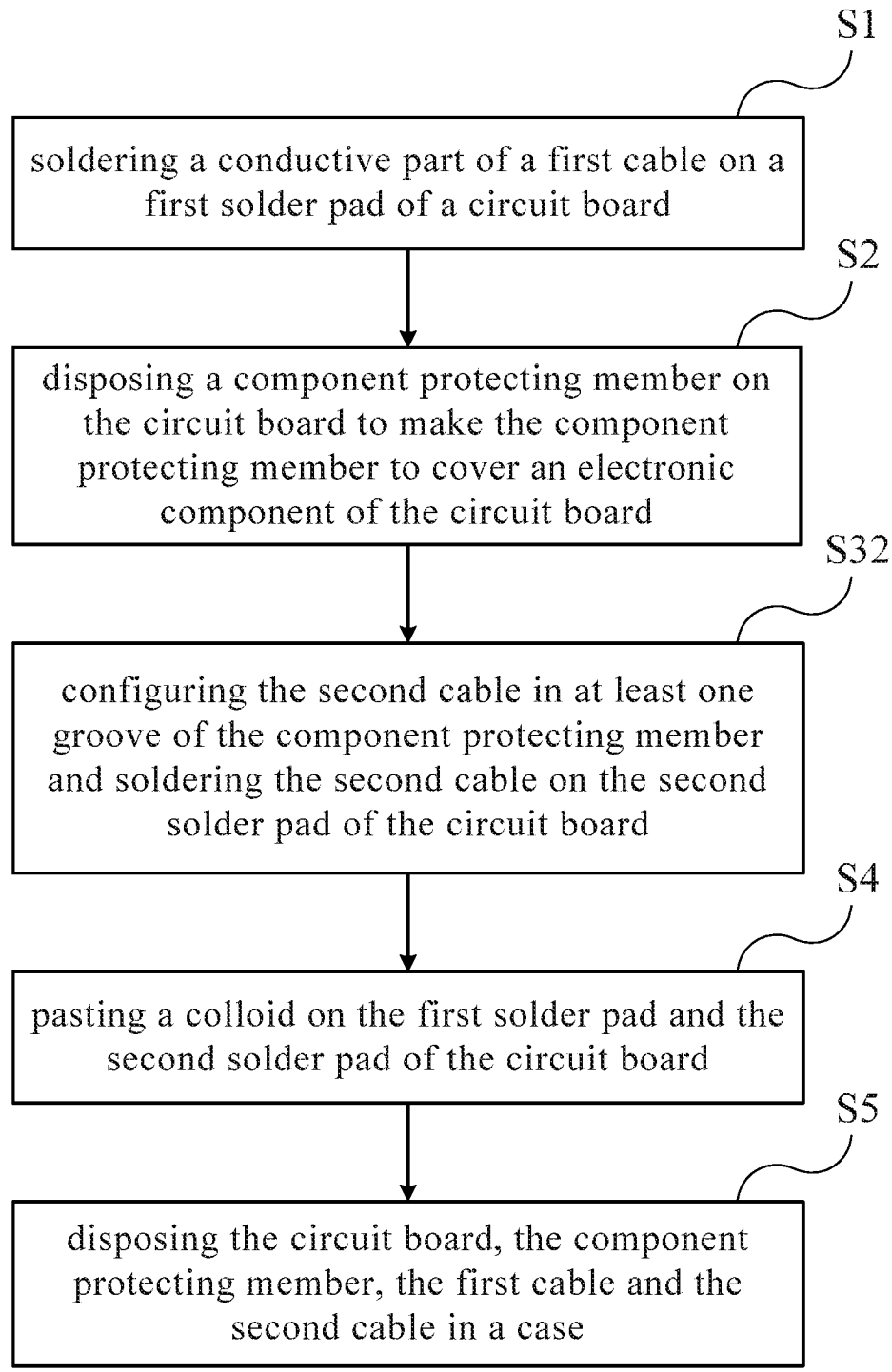
FIG. 12 is a flow diagram illustrating the method for manufacturing the high frequency connector according to another embodiment of the present invention.

Please refer to FIG. 12. FIG. 12 is a flow diagram illustrating the method for manufacturing the high frequency connector according to another one embodiment of the present invention. Step S3 further includes step S32: configuring the second cable in at least one groove of the component protecting member and soldering the second cable on the second solder pad of the circuit board.

In conclusion, the high frequency connector of the present invention ensures that the electronic component contacts optimum dielectric medium to maintain the transmission characteristic of the electronic component by the component protecting member covering the electronic component on the circuit board.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A high frequency connector, comprising:
a case;
a circuit board configured in the case, the circuit board having an electronic component and a plurality of solder pads disposed on the circuit board;
a component protecting member configured on the circuit board, the component protecting member comprising a case body, one side of the case body having an opening and a containing space being formed by the opening and an inner surface of the case body, a crossing structure being disposed on an outer surface of the other side of the case body, the crossing structure further comprising at least one groove, the electronic component being contained in the containing space; and
a cable configured in the groove, the cable comprising an insulating part and a conductive part disposed on the terminal of the cable, the insulating part of the cable being configured on the crossing structure, and the conductive part being soldered on the solder pads of the circuit board.

2. The high frequency connector of claim 1, wherein the circuit board further comprises at least one positioning hole, and the component protecting member comprises at least one positioning pin, the size of the at least one positioning pin is corresponding to that of the positioning hole.

3. The high frequency connector of claim 1, wherein the maximum height of the containing space is greater than that of the electronic component to prevent the electronic component from contacting the inner surface of the case body.

4. The high frequency connector of claim 1, wherein the shape of the crossing structure is one selected from the group consisting of a circular arc shape, a polygonal shape and a combination of both.

5. The high frequency connector of claim 1, further comprising a colloid pasted on the cable and the circuit board, the component protecting member blocking the colloid out of the containing space.

6. A method of manufacturing high frequency connector, comprising:
soldering a conductive part of a first cable on a first solder pad of a circuit board;
disposing a component protecting member on the circuit board to make the component protecting member to cover an electronic component of the circuit board, the component protecting member having at least one groove on the outer surface thereof;
configuring a second cable in the at least one groove and across the component protecting member and soldering the second cable on a second solder pad of the circuit board;
pasting a colloid on the first solder pad and the second solder pad of the circuit board; and disposing the circuit board, the component protecting member, the first cable and the second cable in a case.

7. The method of claim 6, wherein the step of disposing the component protecting member on the circuit board to make the component protecting member to cover the electronic component of the circuit board further comprises the step of:

inserting at least one positioning pin of the component protecting member into at least one positioning hole of the circuit board correspondingly to make a containing space of the component protecting member to contain the electronic component.

8. The method of claim 6, wherein the step of configuring the second cable across the component protecting member and soldering the second cable on the second solder pad of the circuit board further comprises the step of:

configuring the insulating part of the second cable on the crossing structure of the component protecting member, and soldering the conductive part of the second cable on the second solder pad of the circuit board.

* * * * *